(12) United States Patent
Daubenspeck et al.

(10) Patent No.: US 7,863,183 B2
(45) Date of Patent: Jan. 4, 2011

(54) METHOD FOR FABRICATING LAST LEVEL COPPER-TO-C4 CONNECTION WITH INTERFACIAL CAP STRUCTURE

(75) Inventors: Timothy H. Daubenspeck, Colchester, VT (US); William F. Landers, Wappingers Falls, NY (US); Donna S. Zupanski-Nielsen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 916 days.

(21) Appl. No.: 11/306,983

(22) Filed: Jan. 18, 2006

(65) Prior Publication Data

US 2007/0166992 A1 Jul. 19, 2007

(51) Int. Cl.
*H01L 21/4763* (2006.01)

(52) U.S. Cl. .................. 438/629; 438/618; 438/637; 438/641; 438/648; 438/672; 438/761; 438/778

(58) Field of Classification Search .................. 438/618, 438/629, 637, 641, 648, 672, 761, 778, FOR. 355
See application file for complete search history.

(56) References Cited

U.S. PATENT DOCUMENTS

| | | | |
|---|---|---|---|
| 4,284,991 A | 8/1981 | Dupressoir | |
| 4,554,425 A | 11/1985 | Kashiwagi et al. | |
| 4,640,999 A | 2/1987 | Kashiwagi et al. | |
| 4,755,904 A | 7/1988 | Brick et al. | |
| 5,194,161 A | 3/1993 | Heller et al. | |
| 5,403,779 A | 4/1995 | Joshi et al. | |
| 5,585,673 A | 12/1996 | Joshi et al. | |
| 5,602,365 A | 2/1997 | Bobadilla et al. | |
| 5,674,787 A | 10/1997 | Zhao et al. | |
| 5,695,810 A | 12/1997 | Dubin et al. | |
| 5,847,327 A | 12/1998 | Fischer et al. | |
| 5,889,328 A | 3/1999 | Joshi et al. | |
| 5,976,975 A | 11/1999 | Joshi et al. | |
| 6,040,243 A | 3/2000 | Li et al. | |
| 6,093,628 A | 7/2000 | Lim et al. | |
| 6,136,680 A | 10/2000 | Lai et al. | |
| 6,147,402 A | 11/2000 | Joshi et al. | |
| 6,153,935 A | 11/2000 | Edelstein et al. | |
| 6,174,812 B1 | 1/2001 | Hsiung et al. | |
| 6,184,138 B1 | 2/2001 | Ho et al. | |
| 6,245,663 B1 | 6/2001 | Zhao et al. | |
| 6,251,786 B1 | 6/2001 | Zhou et al. | |
| 6,274,499 B1 | 8/2001 | Gupta et al. | |

(Continued)

FOREIGN PATENT DOCUMENTS

JP 2004200273 A 7/2005

*Primary Examiner*—N Drew Richards
*Assistant Examiner*—Joannie A Garcia
(74) *Attorney, Agent, or Firm*—Scully, Scott, Murphy & Presser, P.C.; Katherine S. Brown, Esq.

(57) ABSTRACT

The present invention relates to a method for fabricating a semiconductor device with a last level copper-to-C4 connection that is essentially free of aluminum. Specifically, the last level copper-to-C4 connection comprises an interfacial cap structure containing CoWP, NiMoP, NiMoB, NiReP, NiWP, and combinations thereof. Preferably, the interfacial cap structure comprises at least one CoWP layer. Such a CoWP layer can be readily formed over a last level copper interconnect by a selective electroless plating process.

18 Claims, 4 Drawing Sheets

U.S. PATENT DOCUMENTS

| | | |
|---|---|---|
| 6,287,990 B1 | 9/2001 | Cheung et al. |
| 6,291,333 B1 | 9/2001 | Lou |
| 6,303,523 B2 | 10/2001 | Cheung et al. |
| 6,323,554 B1 | 11/2001 | Joshi et al. |
| 6,342,733 B1 | 1/2002 | Hu et al. |
| 6,344,371 B2 | 2/2002 | Fischer et al. |
| 6,348,725 B2 | 2/2002 | Cheung et al. |
| 6,352,921 B1 | 3/2002 | Han et al. |
| 6,358,832 B1 | 3/2002 | Edelstein et al. |
| 6,413,854 B1 | 7/2002 | Uzoh et al. |
| 6,424,044 B1 | 7/2002 | Han et al. |
| 6,503,834 B1 | 1/2003 | Chen et al. |
| 6,511,903 B1 | 1/2003 | Yau et al. |
| 6,511,909 B1 | 1/2003 | Yau et al. |
| 6,518,668 B2 | 2/2003 | Cohen |
| 6,528,185 B2 | 3/2003 | Man et al. |
| 6,531,386 B1 | 3/2003 | Lim et al. |
| 6,534,863 B2 | 3/2003 | Walker et al. |
| 6,537,929 B1 | 3/2003 | Cheung et al. |
| 6,541,282 B1 | 4/2003 | Cheung et al. |
| 6,544,698 B1 | 4/2003 | Fries |
| 6,554,002 B2 | 4/2003 | Wu et al. |
| 6,562,690 B1 | 5/2003 | Cheung et al. |
| 6,589,881 B2 | 7/2003 | Huang et al. |
| 6,596,655 B1 | 7/2003 | Cheung et al. |
| 6,610,151 B1 | 8/2003 | Cohen |
| 6,617,690 B1 | 9/2003 | Gates et al. |
| 6,660,656 B2 | 12/2003 | Cheung et al. |
| 6,660,663 B1 | 12/2003 | Cheung et al. |
| 6,709,874 B2 | 3/2004 | Ning |
| 6,716,749 B2 | 4/2004 | Noguchi et al. |
| 6,719,884 B2 | 4/2004 | Marsh et al. |
| 6,723,631 B2 | 4/2004 | Noguchi et al. |
| 6,724,069 B2 | 4/2004 | Dalton et al. |
| 6,730,593 B2 | 5/2004 | Yau et al. |
| 6,730,594 B2 | 5/2004 | Noguchi et al. |
| 6,737,747 B2 | 5/2004 | Barth et al. |
| 6,750,113 B2 | 6/2004 | Armacost et al. |
| 6,756,679 B2 | 6/2004 | Noguchi et al. |
| 6,764,796 B2 | 7/2004 | Fries |
| 6,767,827 B1 | 7/2004 | Okada et al. |
| 6,770,556 B2 | 8/2004 | Yau et al. |
| 6,821,324 B2 | 11/2004 | Shacham-Diamand et al. |
| 6,827,868 B2 * | 12/2004 | Daubenspeck et al. ........ 216/17 |
| 7,002,252 B2 * | 2/2006 | Yamamoto ................. 257/758 |
| 7,138,717 B2 * | 11/2006 | Wang et al. ................. 257/760 |
| 7,207,096 B2 * | 4/2007 | Gambino et al. ........... 29/602.1 |
| 7,253,105 B2 * | 8/2007 | Dimitrakopoulos et al. . 438/674 |
| 7,273,803 B2 * | 9/2007 | Cheng et al. ................ 438/612 |
| 7,279,411 B2 * | 10/2007 | Agarwala et al. ........... 438/618 |
| 2001/0029065 A1 | 10/2001 | Fischer et al. |
| 2002/0042193 A1 | 4/2002 | Noguchi et al. |
| 2002/0076918 A1 | 6/2002 | Han et al. |
| 2002/0094656 A1 | 7/2002 | Armacost et al. |
| 2002/0102834 A1 | 8/2002 | Yang et al. |
| 2002/0111010 A1 | 8/2002 | Walker et al. |
| 2002/0113037 A1 | 8/2002 | Wu et al. |
| 2002/0119651 A1 | 8/2002 | Noguchi et al. |
| 2002/0127842 A1 | 9/2002 | Noguchi et al. |
| 2002/0127843 A1 | 9/2002 | Noguchi et al. |
| 2002/0142576 A1 | 10/2002 | Noguchi et al. |
| 2003/0001183 A1 | 1/2003 | Noguchi et al. |
| 2003/0001277 A1 | 1/2003 | Noguchi et al. |
| 2003/0001280 A1 | 1/2003 | Noguchi et al. |
| 2003/0017692 A1 | 1/2003 | Noguchi et al. |
| 2003/0045086 A1 | 3/2003 | Noguchi et al. |
| 2003/0072947 A1 | 4/2003 | Lee et al. |
| 2003/0087513 A1 | 5/2003 | Noguchi et al. |
| 2003/0132510 A1 | 7/2003 | Barth et al. |
| 2003/0134495 A1 | 7/2003 | Gates et al. |
| 2003/0134499 A1 | 7/2003 | Chen et al. |
| 2003/0205817 A1 | 11/2003 | Romankiw |
| 2004/0113277 A1 | 6/2004 | Chiras et al. |
| 2004/0115873 A1 | 6/2004 | Chen et al. |
| 2004/0137709 A1 | 7/2004 | Zhang et al. |
| 2004/0147127 A1 | 7/2004 | Noguchi et al. |
| 2004/0173907 A1 | 9/2004 | Chen et al. |
| 2004/0173908 A1 | 9/2004 | Barth et al. |
| 2004/0175922 A1 | 9/2004 | Solomentsev et al. |
| 2004/0234679 A1 | 11/2004 | Edelstein et al. |
| 2005/0064701 A1 * | 3/2005 | Dalton et al. ................ 438/627 |
| 2005/0160575 A1 | 7/2005 | Gambino et al. |
| 2006/0093004 A1 * | 5/2006 | Ma ........................ 372/46.01 |
| 2006/0099816 A1 * | 5/2006 | Dalton et al. ................ 438/710 |
| 2007/0161226 A1 * | 7/2007 | Dalton et al. ................ 438/622 |
| 2007/0222073 A1 * | 9/2007 | Farooq et al. ................ 257/738 |

* cited by examiner

METHOD FOR FABRICATING LAST LEVEL COPPER-TO-C4 CONNECTION WITH INTERFACIAL CAP STRUCTURE

FIELD OF THE INVENTION

This invention relates to high-speed integrated circuit (IC) devices that contain conductive metallization. More specifically, the present invention relates to a method for fabricating an interfacial cap structure between the last level copper interconnect of an IC chip and a controlled-collapse chip connection (C4).

BACKGROUND OF THE INVENTION

In the fabrication of semiconductor devices, metal lines are often embedded in dielectric layers in a multilevel structure, particularly in the latter stage ("back end of the line" or "BEOL") of the fabrication process. The last layer of metal lines (sometimes referred to in the art as the terminal via or TV layer) with metal pads formed thereon are fabricated by a process typically referred to as "far back end of line" or "FBEOL." The pads and metal lines together provide last level interconnects from an IC chip to other system components. The majority of IC chips use aluminum (Al) to form the interconnects, but more recently copper (Cu) interconnects are used. The advantages of using Cu rather than Al interconnects include higher conductivity (with lower resistance), lower capacitive load, lower power consumption, less cross talk, fewer metal layers, and few potential manufacturing steps.

An IC chip containing copper interconnects may be electrically connected to a substrate or other electrical components by solder bumps, which are also commonly referred to as flip chip bonds. Solder bump technology (also known as flip chip technology in the art) provides higher density and higher performance connections. An example of solder bump technology is controlled-collapse chip connection (C4), in which solder bumps are provided on both the IC chip and the substrate, and the connection is established by aligning the solder bumps of the IC chip and the substrate and reflowing the solder to make the connection. In a typical C4 connection, a solder bump is formed by first depositing solder on a ball-limiting metallurgy (BLM), which is formed over a copper interconnect located in a substrate, followed by heating the solder to above its melting temperature, thereby causing reflow of the solder into a ball. The size and shape of the solder ball so formed is limited by the dimension of the BLM due to surface tension.

However, tin (Sn) contained in the solder bump may diffuse into the copper interconnect, and it typically interacts with Cu to form a brittle Cu/Sn intermetallic interface, which leads to disconnection of the copper interconnect from the solder bump. In order to prevent the solder from diffusing into the copper interconnect, at least one aluminum capping layer is provided between the solder bump and the copper interconnect. Further, additional diffusion barrier layers containing materials, such as titanium nitride or tantalum nitride, are provided between the aluminum capping layer and the copper interconnect, in order to prevent diffusion of copper into the aluminum capping layer. Fabrication of such an aluminum capping layer and associated diffusion barrier layers involves multiple processing steps, which significantly increase the manufacturing cost of IC chips.

There is therefore a continuing need for improved capping structures in the last level copper-to-C4 connections. Preferably, such improved capping structures: (1) provide good electrical connection between the last level copper interconnects and the C4 solder bumps, (2) eliminate or reduce Sn diffusion into the copper interconnects, and (3) can be fabricated by a simpler fabrication process at lower costs, in comparison with conventional aluminum-based capping structures.

SUMMARY OF THE INVENTION

In one aspect, the present invention relates to a method comprising:

providing a semiconductor device that comprises a last level copper interconnect embedded in a last level dielectric layer;

forming an interfacial conductive cap structure that selectively covers the last level copper interconnect, wherein the interfacial conductive cap structure comprises CoWP, NiMoP, NiMoB, NiReP, NiWP, or combinations thereof;

forming a first dielectric cap layer over the interfacial conductive cap structure and the last level dielectric layer;

forming at least one additional dielectric cap layer over the first dielectric cap layer;

forming a via through the first dielectric cap layer and the at least one additional dielectric cap layer to expose the interfacial conductive cap structure;

forming at least one ball-limiting metallurgy (BLM) layer in the via over the interfacial conductive cap structure; and forming at least one controlled-collapse chip connection (C4) over the at least one BLM layer.

The interfacial conductive cap structure preferably comprises a CoWP layer that is about 200 Å to about 1000 Å thick, more preferably from about 400 Å to about 500 Å thick, and most preferably, the interfacial conductive cap structure is essentially free of aluminum.

Such an interfacial conductive cap structure may be embedded in the first dielectric cap layer, which preferably comprises silicon nitride and is about 100 Å to about 300 Å thick.

Further, the last level copper interconnect, the interfacial conductive cap structure, the at least one BLM layer, and the at least one C4 connection form an electrically conductive path that extends through the first dielectric cap layer and the at least one additional dielectric cap layer. In a preferred, but not necessary, embodiment of the present invention, there are three additional dielectric cap layers located over the first dielectric cap layer, which include a silicon dioxide layer, a silicon nitride layer, and a photosensitive polyimide layer.

The interfacial conducive cap structure can be formed by a selective electroless plating process. Further, the via is formed by first selectively removing a portion of the at least one additional dielectric cap layer to expose the first dielectric cap layer, and then selectively removing the exposed portion of the first dielectric cap layer, stopping at the interfacial conductive cap structure. More preferably, the exposed portion of the first dielectric cap layer is selectively removed by a pre-BLM sputter clean process.

In another aspect, the present invention relates to a method comprising:

providing a semiconductor device that comprises a last level copper interconnect embedded in a last level dielectric layer;

forming an interfacial conductive cap structure that selectively covers the last level copper interconnect;

forming a first dielectric cap layer over the interfacial conductive cap structure and the last level dielectric layer;

forming at least one additional dielectric cap layer over the first dielectric cap layer;

selectively removing a portion of the at least one additional dielectric cap layer to expose the first dielectric cap layer;

conducting in situ sputter cleaning, which selectively removes the exposed portion of the first dielectric cap layer, stopping at the at least one additional dielectric cap layer;

forming at least one ball-limiting metallurgy (BLM) layer over the interfacial conductive cap structure; and forming at least one controlled-collapse chip connection (C4) over the at least one BLM layer.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1:
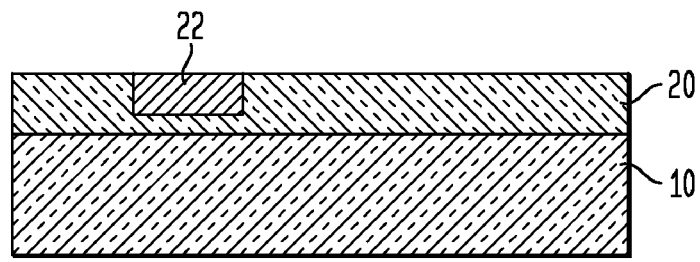
FIGS. 1-9 are cross-sectional views that illustrate the processing steps for forming an exemplary copper-to-C4 connection having the aluminum-free interfacial conductive cap structure, according to one embodiment of the present invention.

The following U.S. patent application is incorporated herein by reference in its entirety for all purposes:

U.S. patent application Ser. No. 10/707,896 filed on Jan. 22, 2004 for "INTEGRATION OF HIGH PERFORMANCE COPPER INDUCTORS WITH BOND PADS," which was published on Jul. 28, 2005 as U.S. Patent Application Publication No. 2005/0160575 A1.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides a novel interfacial conductive capping structure in the last level copper-to-C4 connections. Specifically, the interfacial conductive capping structure is essentially free of aluminum, which is typically employed in conventional last level copper-to-C4 connections to cap the copper interconnects. Instead, the interfacial conductive capping structure of the present invention comprises a thin CoWP layer formed over the copper interconnect by selective electroless plating. In this manner, the present invention obviates the need for the aluminum cap layer and the associated diffusion barrier layers, therefore simplifying the fabrication process for the last level copper-to-C4 connections and significantly reducing the manufacturing costs.

The present invention further provides a thin dielectric cap layer over the thin CoWP layer to protect the CoWP layer against pre-BLM sputter cleaning. In absence of the dielectric cap layer, the pre-BLM sputter cleaning process may remove a portion of the CoWP layer. The thin dielectric cap layer acts as a sacrificial protective layer, i.e., a portion of the thin dielectric cap layer is removed by the pre-BLM sputter cleaning in place of the CoWP layer. The thin dielectric cap layer is preferably formed of silicon nitride. However, it may be formed of any other suitable dielectric material(s) that can protect the CoWP layer against the pre-BLM sputter cleaning process.

Process steps for forming the interfacial conductive capping structure of the present invention will now be described in greater detail by referring to the accompanying FIGS. 1-9.

Note that in these drawings, which are not drawn to scale, like and/or corresponding elements are referred to by like reference numerals. It is also to be noted that in the drawings, only one copper interconnect and one C4 solder bump are shown. Although illustration is made to such an embodiment, the present invention is not limited to the formation of any specific number of copper interconnects and C4 solder bumps.

Reference is first made to FIG. 1, which shows a partial view of a semiconductor device comprising a last level dielectric layer 20 formed over an inter-level dielectric layer 10. At least one last level copper interconnect 22 is embedded in the last level dielectric layer 20, with an upper surface of the last level copper interconnect 22 being exposed.

The inter-level dielectric layer 10 may comprise any suitable dielectric material(s) commonly used for forming inter-level dielectric, such as, for example, silicon dioxide, silicon nitride, and silicon oxynitrides, etc. Organic dielectrics, such as polyarylene ethers, doped silicates, and carbon-doped oxides, can also be used. Preferably, the inter-level dielectric layer 10 comprises silicon dioxide formed by a chemical vapor deposition process using tetraethylorthosilicate (TEOS)-based chemistry. The thickness of the inter-level dielectric layer 10 typically ranges from about 5000 Å to about 10000 Å, more typically from about 7000 Å to about 9000 Å.

The last level dielectric layer 20 may comprise any suitable dielectric material(s), including, but not limited to: silicon dioxides, silicon nitrides, silicon oxynitrides, fluorinated silicate glass (FSG), etc. Preferably, the last level dielectric layer 20 contains FSG. The thickness of the last level dielectric layer 20 typically ranges from about 2000 Å to about 5000 Å, more typically from about 3000 Å to about 4000 Å.

The last level copper interconnect 22 may comprise wirings fabricated at a minimum lithographic feature size designated about 1× (referred to as "thinwires") and above these levels are about 2 to 4 wiring levels fabricated at a width equal to about 2× and/or about 4× the minimum width of the thinwires (referred to as "fatwires"). Preferably, the last level copper interconnect 22 comprises a fat wire.

The last level copper interconnect 22 and the last level dielectric layer 20 may be formed by conventional processing steps, which include dielectric deposition, trench patterning, Cu deposition, and chemical mechanical polishing (CMP). Optionally, a liner (not shown) comprising TaN or TiN can be deposited over the trench before the Cu deposition.

Figure 2:
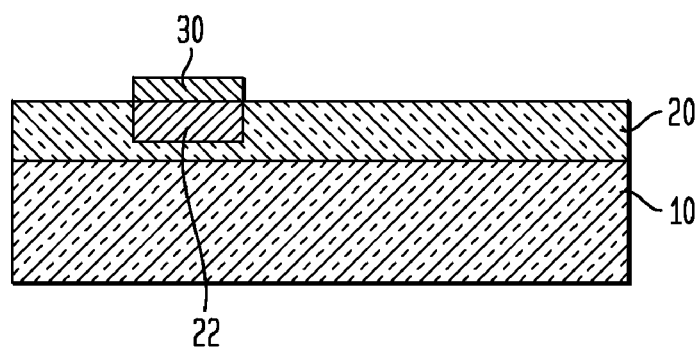
Figure 3:
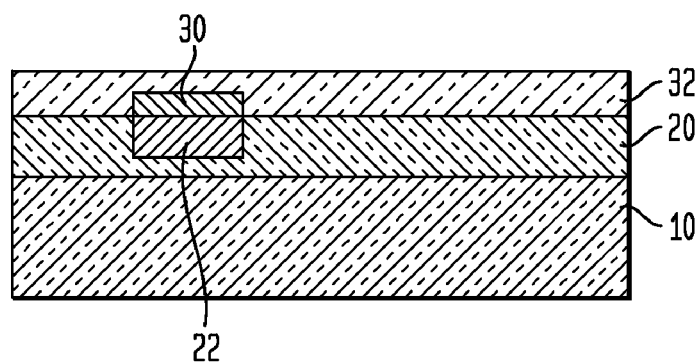

FIG. 2 shows formation of a thin interfacial conductive cap layer 30, which selectively covers the copper interconnect 22. The thin interfacial conductive cap layer 30 preferably comprises CoWP, which can be readily formed by selective electroless plating. Other conductive materials, such as NiMoP, NiMoP, NiReP, and NiWP, can also be selectively deposited over the copper interconnect 22 by electroless plating and therefore can also be used in the present invention for forming the interfacial conductive cap layer 30, which functions to prevent Sn diffusion from C4 solder bumps (to be formed in subsequent processing steps) into the last level copper interconnect 22 and also provide good electrical connection between the last level copper interconnect 22 and the C4 solder bumps.

Subsequently, a thin dielectric cap layer 32 is formed over the thin interfacial conductive cap layer 30 and the last level dielectric layer 20. The thin dielectric cap layer 32 may comprise any suitable dielectric material(s), including, but not limited to: silicon dioxides, silicon nitrides, silicon oxynitrides, and combinations thereof. Preferably, the thin dielectric cap layer 32 comprises silicon nitride, and it acts as a sacrificial protective layer during subsequent pre-BLM sputter cleaning and thereby protects the interfacial conductive cap layer 30 against the pre-BLM sputter cleaning.

Both the last level dielectric layer 20 and the thin dielectric cap layer 32 can be formed by any suitable dielectric deposition processes, including, but not limited to: high density plasma deposition (HDP), plasma-enhanced chemical vapor deposition (PECVD), etc. Preferably, the thin dielectric cap layer 32 is formed by an HDP process, which provides good conformity to the underlying structure.

Figure 4:
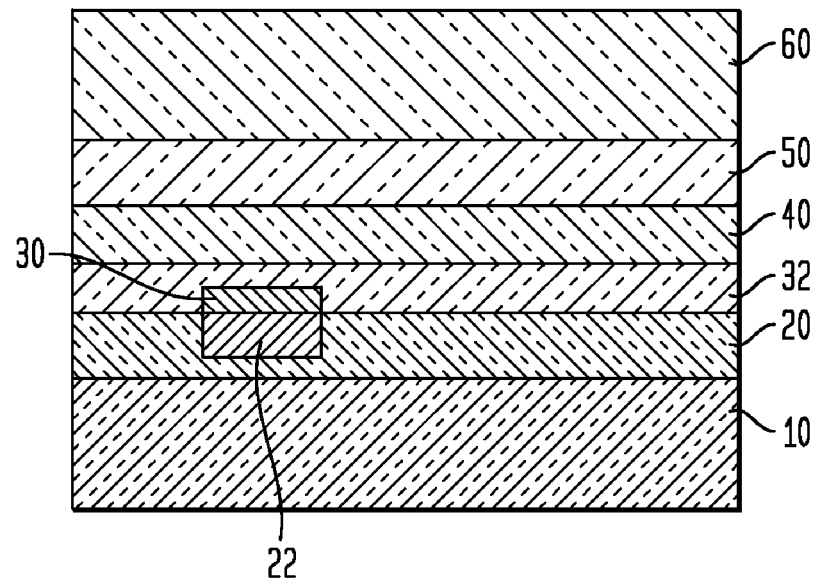

Next, additional dielectric capping layers, which include at least a silicon dioxide layer 40, a silicon nitride layer 50, and a photosensitive polyimide layer 60, are sequentially deposited over the thin dielectric cap layer 32, as shown in FIG. 4. The silicon dioxide layer 40 preferably has a thickness of from about 2500 Å to about 6500 Å, more preferably from about 4000 Å to about 5000 Å, while the silicon nitride layer 50 preferably has a thickness of from about 2000 Å to about 6000 Å, more preferably from about 3500 Å to about 4500 Å.

Figure 5:
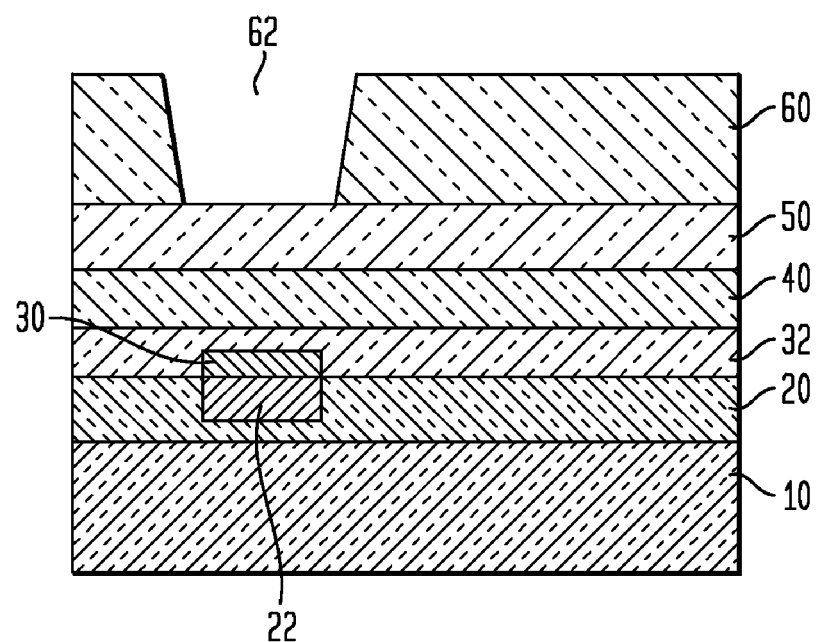

The photosensitive polyimide layer 60, which functions as a passivation layer in the present invention, can be directly patterned and etched to form a contact opening 62, thereby exposing an upper surface of the silicon nitride layer 50, as shown in FIG. 5. In recent years, photosensitive polyimide has frequently been used in semiconductor devices, due to the fact that it can be patterned like a photoresist mask and can, after patterning and etching, remain on the surface on which it has been deposited to serve as a passivation layer. Typically, a polyimide precursor layer is first deposited by, for example, conventional photoresist spin coating, followed by treatment steps including low temperature pre-bake and exposure to ultraviolet (UV) light. The portions of the polyimide precursor that have been exposed to the UV light are cross-linked, thereby leaving unexposed regions, which are not cross linked, to define a set of contact openings. During subsequent development, the uncross-linked polyimide precursor material in the unexposed regions is dissolved, thereby providing the desired contact openings. A final step of thermal curing leaves a permanent high quality passivation layer of patterned polyimide with contact openings formed therein.

Figure 6:
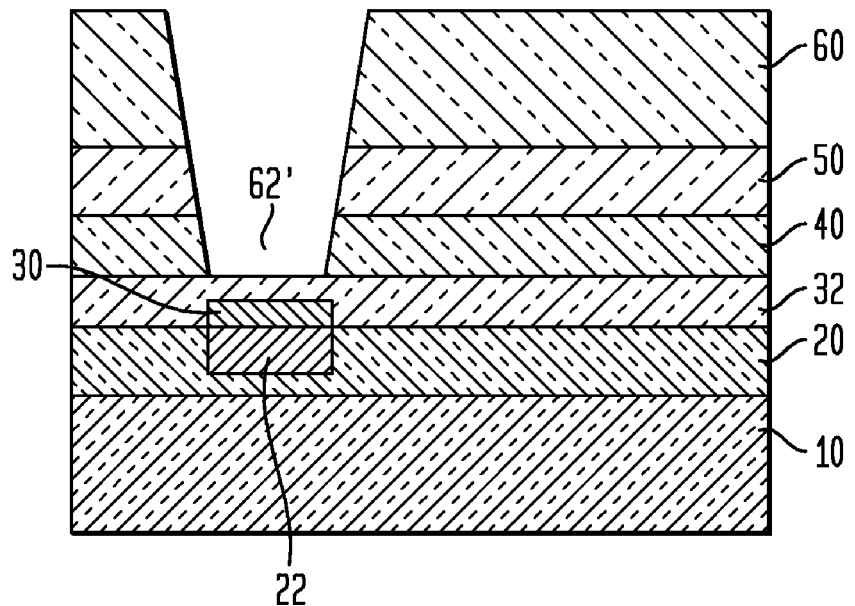

Subsequently, the patterned photosensitive polyimide layer 60 is used as a mask for selectively removing a portion of the silicon nitride layer 50 and the silicon dioxide layer 40 to form a trench 62' that exposes an upper surface of the thin dielectric capping layer 32, as shown in FIG. 6. Selective removal of the silicon nitride layer 50 and the silicon dioxide layer 40 can be readily carried out utilizing one or more dry-etching steps. Suitable dry-etching processes that can be used in the present invention in forming the trench 62' include, but not limited to: reactive ion etching (RIE), ion beam etching, plasma etching or laser ablation. Preferably, a portion of the silicon nitride layer 50 and the silicon dioxide layer 40 are selectively removed using RIE techniques.

Figure 7:
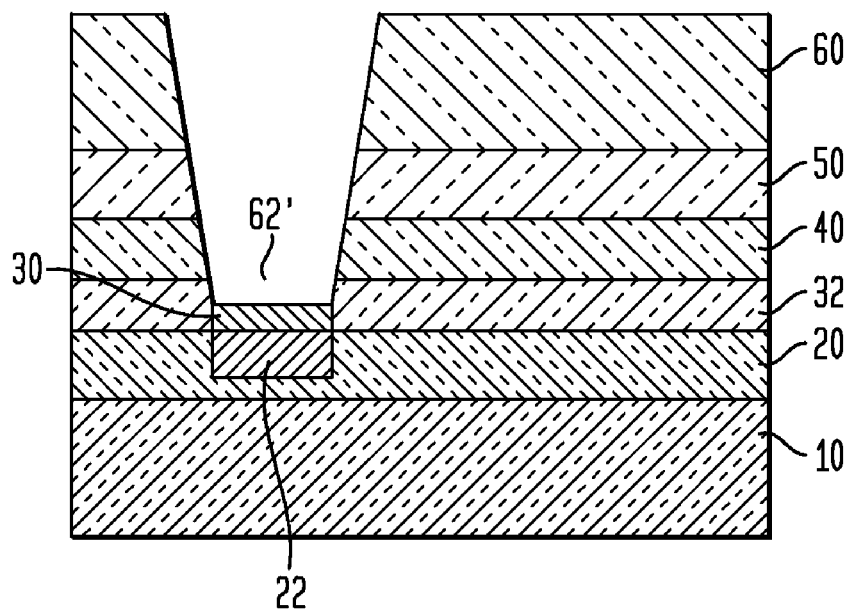

Next, in situ sputter clean is performed on the exposed surface of the trench 62', using a sputter ion-milling tool in which Ar mixed with $H_2$ is employed as a cleaning agent. The sputter clean removes an upper portion of the thin dielectric capping layer 32 to expose the interfacial conductive cap layer 30 thereunder, as shown in FIG. 7.

Figure 8:
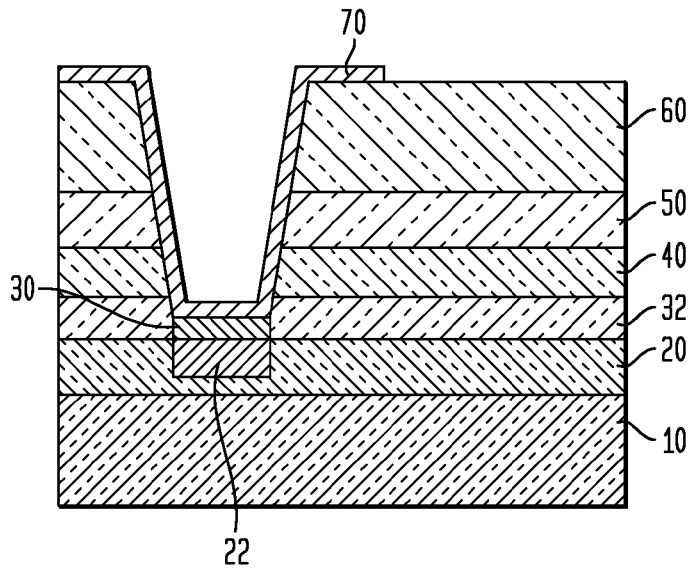
Figure 9:
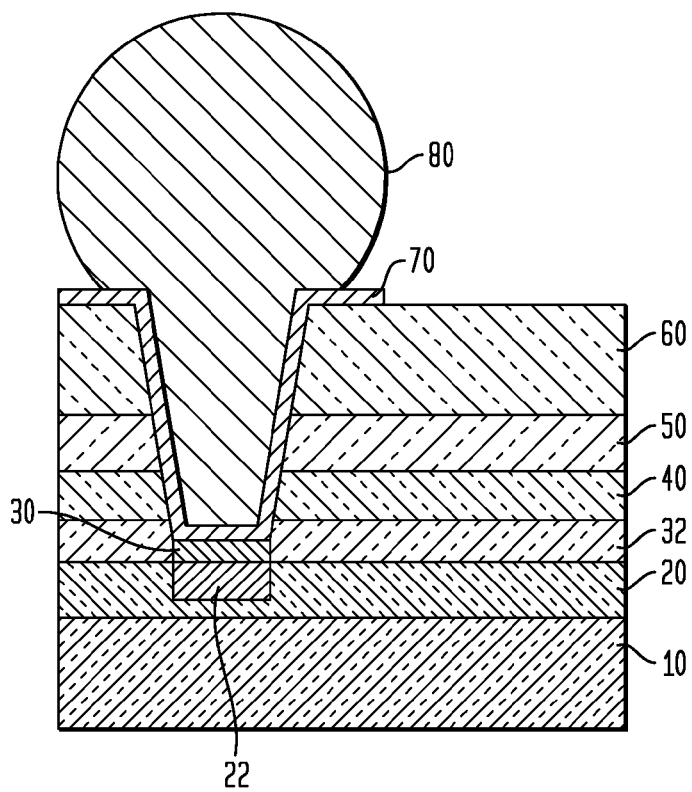

FIGS. 8 and 9 shows formation of one or more BLM layers 70 over the trench 62', followed by formation of a C4 solder ball 80 over the BLM layers 70, using conventional C4 processing steps.

The complete structure as shown in FIG. 9 contains an interfacial conductive capping structure, i.e., the interfacial conductive capping layer 30, which is sandwiched between the last level copper interconnect 22 and the BLM layer(s) 70. Such an interfacial conductive capping structure does not contain any aluminum layer or any diffusion barrier layers required for preventing diffusion of copper into aluminum, and the process used for fabricating such an interfacial conductive capping structure of the present invention is significantly simpler than that used for fabricating the conventional aluminum cap layer and the associated diffusion barrier layers. As a result, the overall manufacturing costs for semiconductor devices containing the interfacial conductive capping structures of the present invention are significantly reduced.

The last level copper-to-C4 connection structure of the present invention can be readily used with various electrical devices, which include, but are not limited to: transistors, diodes, resistors, inductors, capacitors, etc. For example, the copper-to-C4 connection structure of the present invention can be integrated with an inductor, as described by U.S. patent application Ser. No. 10/707,896, the content of which is incorporated herein by reference in its entirety. Alternatively, it can be used with other devices, such as transistors, diodes, resistors, capacitors, etc., without being coupled with any inductor.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method comprising:
   providing a semiconductor device that comprises a last level copper interconnect embedded in a last level dielectric layer, said last level copper interconnect is a fat wire;
   forming an interfacial conductive cap structure that selectively covers the last level copper interconnect, wherein said interfacial conductive cap structure comprises CoWP, NiMoP, NiMoB, NiReP, NiWP, or combinations thereof;
   forming a first dielectric cap layer over the interfacial conductive cap structure and the last level dielectric layer, wherein the first dielectric cap layer comprises silicon nitride and has a thickness ranging from about 100 Å to about 300 Å;
   forming at least three additional dielectric cap layers over the first dielectric cap layer, which includes a silicon dioxide layer, a silicon nitride layer, and a photosensitive polyimide layer;
   forming a via through the first dielectric cap layer and the at least three additional dielectric cap layers to expose the interfacial conductive cap structure, wherein the via is formed by first selectively removing a portion of the at least three additional dielectric cap layers to expose the first dielectric cap layer, and then selectively removing the exposed portion of the first dielectric cap layer, stopping at the interfacial conductive cap structure;

forming at least one ball-limiting metallurgy (BLM) layer in the via over the interfacial conductive cap structure; and forming at least one controlled-collapse chip connection (C4) over the at least one BLM layer.

2. The method of claim 1, wherein the interfacial conductive cap structure is essentially free of aluminum.

3. The method of claim 1, wherein the interfacial conductive cap structure comprises a CoWP layer having a thickness ranging from about 200 Å to about 1000 Å.

4. The method of claim 1, wherein the interfacial conductive cap structure is embedded in the first dielectric cap layer.

5. The method of claim 1, wherein the last level copper interconnect, the interfacial conductive cap structure, the at least one BLM layer, and the at least one C4 connection form an electrically conductive path that extends through the first dielectric cap layer and the at least one additional dielectric cap layer.

6. The method of claim 1, wherein the last level dielectric layer comprises fluorinated silica glass.

7. The method of claim 1, wherein the interfacial conductive cap structure is formed by selective electroless plating.

8. The method of claim 1, wherein the portion of the first dielectric cap layer is selectively removed by a pre-BLM sputter clean process.

9. A method comprising:
providing a semiconductor device that comprises a last level copper interconnect embedded in a last level dielectric layer;
forming an interfacial conductive cap structure that selectively covers the last level copper interconnect;
forming a first dielectric cap layer over the interfacial conductive cap structure and the last level dielectric layer;
forming at least three additional dielectric cap layers over the first dielectric cap layer, which include a silicon dioxide layer, a silicon nitride layer, and a photosensitive polyimide layer;
selectively removing a portion of said at least three additional dielectric cap layers to expose the first dielectric cap layer;
conducting in situ sputter cleaning, which selectively removes the exposed portion of the first dielectric cap layer, stopping at the at least one additional dielectric cap layer;
forming at least one ball-limiting metallurgy (BLM) layer over the interfacial conductive cap structure; and
forming at least one controlled-collapse chip connection (C4) over the at least one BLM layer.

10. The method of claim 9, wherein the interfacial conductive cap structure is formed by selective electroless plating.

11. The method of claim 9, wherein the interfacial conductive cap structure is essentially free of aluminum.

12. The method of claim 9, wherein the interfacial conductive cap structure comprises a CoWP layer having a thickness ranging from about 200 Å to about 1000 Å.

13. The method of claim 9, wherein the first dielectric cap layer comprises silicon nitride and has a thickness ranging from about 100 Å to about 300 Å.

14. The method of claim 9, wherein the last level copper interconnect, the interfacial conductive cap structure, the at least one BLM layer, and the at least one C4 connection form an electrically conductive path that extends through the first dielectric cap layer and the at least one additional dielectric cap layer.

15. A method comprising:
providing a semiconductor device that comprises a last level copper interconnect embedded in a last level dielectric layer;
forming an interfacial conductive cap structure that selectively covers the last level copper interconnect, wherein said interfacial conductive cap structure comprises CoWP, NiMoP, NiMoB, NiReP, NiWP, or combinations thereof;
forming a first dielectric cap layer over the interfacial conductive cap structure and the last level dielectric layer;
forming at least one additional dielectric cap layer over the first dielectric cap layer;
forming a via through the first dielectric cap layer and the at least one additional dielectric cap layer to expose the interfacial conductive cap structure, wherein said forming said via includes selectively removing a portion of the at least one additional dielectric cap layer to expose the first dielectric cap layer, and then selectively removing the exposed portion of the first dielectric cap layer, stopping at the interfacial conductive cap structure;
forming at least one ball-limiting metallurgy (BLM) layer in the via over the interfacial conductive cap structure; and
forming at least one controlled-collapse chip connection (C4) over the at least one BLM layer.

16. The method of claim 15 wherein said selectively removing the exposed portion of the first dielectric cap layer comprises a pre-BLM sputter clean process.

17. A method comprising:
providing a semiconductor device that comprises a last level copper interconnect embedded in a last level dielectric layer;
forming an interfacial conductive cap structure that selectively covers the last level copper interconnect, wherein said interfacial conductive cap structure comprises CoWP, NiMoP, NiMoB, NiReP, NiWP, or combinations thereof;
forming a first dielectric cap layer over the interfacial conductive cap structure and the last level dielectric layer, wherein the first dielectric cap layer comprises silicon nitride and has a thickness ranging from about 100 Å to about 300 Å;
forming at least one additional dielectric cap layer over the first dielectric cap layer;
forming a via through the first dielectric cap layer and the at least one additional dielectric cap layer to expose the interfacial conductive cap structure, wherein said via is formed by first selectively removing a portion of the at least one additional dielectric cap layer to expose the first dielectric cap layer, and then selectively removing the exposed portion of the first dielectric cap layer, stopping at the interfacial conductive cap structure;
forming at least one ball-limiting metallurgy (BLM) layer in the via over the interfacial conductive cap structure; and
forming at least one controlled-collapse chip connection (C4) over the at least one BLM layer.

18. The method of claim 17 wherein said selectively removing the exposed portion of the first dielectric cap layer comprises a pre-BLM sputter clean process.

* * * * *